United States Patent
Ashby et al.

[11] Patent Number: 6,150,885
[45] Date of Patent: Nov. 21, 2000

[54] TRANSCONDUCTANCE AMPLIFIER WITH WIDEBAND NOISE FILTERING

[75] Inventors: Kirk Burton Ashby, Muhlenberg Township; Brian K. Horton, Sinking Spring, both of Pa.

[73] Assignee: Lucent Technologies Inc., Murray Hill, N.J.

[21] Appl. No.: 09/339,750

[22] Filed: Jun. 24, 1999

[51] Int. Cl.[7] .................................................. H03F 3/45
[52] U.S. Cl. .......................... 330/257; 330/260; 330/300
[58] Field of Search ................................. 330/252, 253, 330/257, 260, 300

[56] References Cited

U.S. PATENT DOCUMENTS

| | | | |
|---|---|---|---|
| 5,113,147 | 5/1992 | Klein | 330/257 X |
| 5,565,815 | 10/1996 | Klein | 330/257 X |
| 5,917,379 | 6/1999 | Ashby et al. | 330/260 |

*Primary Examiner*—Steven J. Mottola
*Attorney, Agent, or Firm*—David L. Smith

[57] ABSTRACT

There is disclosed a transconductance amplifier receives a voltage input and provides a current output. The transconductance amplifier includes a current mirror having a low-pass filter between transistors implementing the current mirror.

14 Claims, 10 Drawing Sheets

TRANSCONDUCTANCE AMPLIFIER WITH WIDEBAND NOISE FILTERING

FIELD OF THE INVENTION

This application relates to communication systems, and particularly to a communication system including a transconductance amplifier with wideband noise filtering.

BACKGROUND OF THE INVENTION

A communications system from which at least one way, and usually two way, communications between a transmitter that may be part of a first transceiver and a receiver that may be part of a second transceiver. In many communications systems, a transconductance amplifier as part of a modulator is used to translate an input voltage to an output current. The voltage-to-current transformation should be linear over the frequency range of operation of the transconductance amplifier. The design of voltage-to-current transconductance amplifiers that maintain linearity over a wide operating frequency range has been very difficult.

Wideband noise generated by the transconductance amplifier, and other circuits in a communication system, may be upconverted down-stream of the transconductance amplifier and can cause interference with a receiver. To prevent interference with a receiver, the modulator output signal is often filtered to reduce noise generated by the modulator in the receive band. Once upconverted, the noise that must be filtered is separated from the desired transmit signal by a relatively small spatial difference in frequency, necessitating a high quality factor filter to achieve the filtering. High frequency, high quality factor filters are not readily implemented on an integrated circuit due to the lack of high quality factor inductors. Instead, a filter external to the integrated circuit is typically employed to reduce the wideband noise in the receive band to an acceptably low level. Such a filter can be placed either prior to the signal being provided to a power amplifier, or subsequent to the signal being amplified by the power amplifier. The upconverted signal is passed through a power amplifier to drive the antenna. Filtering after amplifying has the drawback that in addition to filtering the noise, the desired signal will be attenuated slightly due to the insertion loss of the filter, and the power amplifier must compensate for this loss by providing additional power. This is especially undesirable for battery powered devices.

What is needed is a highly linear transconductance amplifier with improved wideband noise filtering characteristics that can be readily implemented on an integrated circuit. Such a transconductance amplifier would either eliminate the need for a separate high Q filter downstream of the transconductance amplifier, or it would reduce the filtering requirements on the downstream filter resulting in a lower cost filter.

SUMMARY OF THE INVENTION

In accordance with the invention, a transconductance amplifier receives a voltage input and provides a current output. The transconductance amplifier includes a current mirror having a lowpass filter between transistors implementing the current mirror.

DETAILED DESCRIPTION

Figure 1:
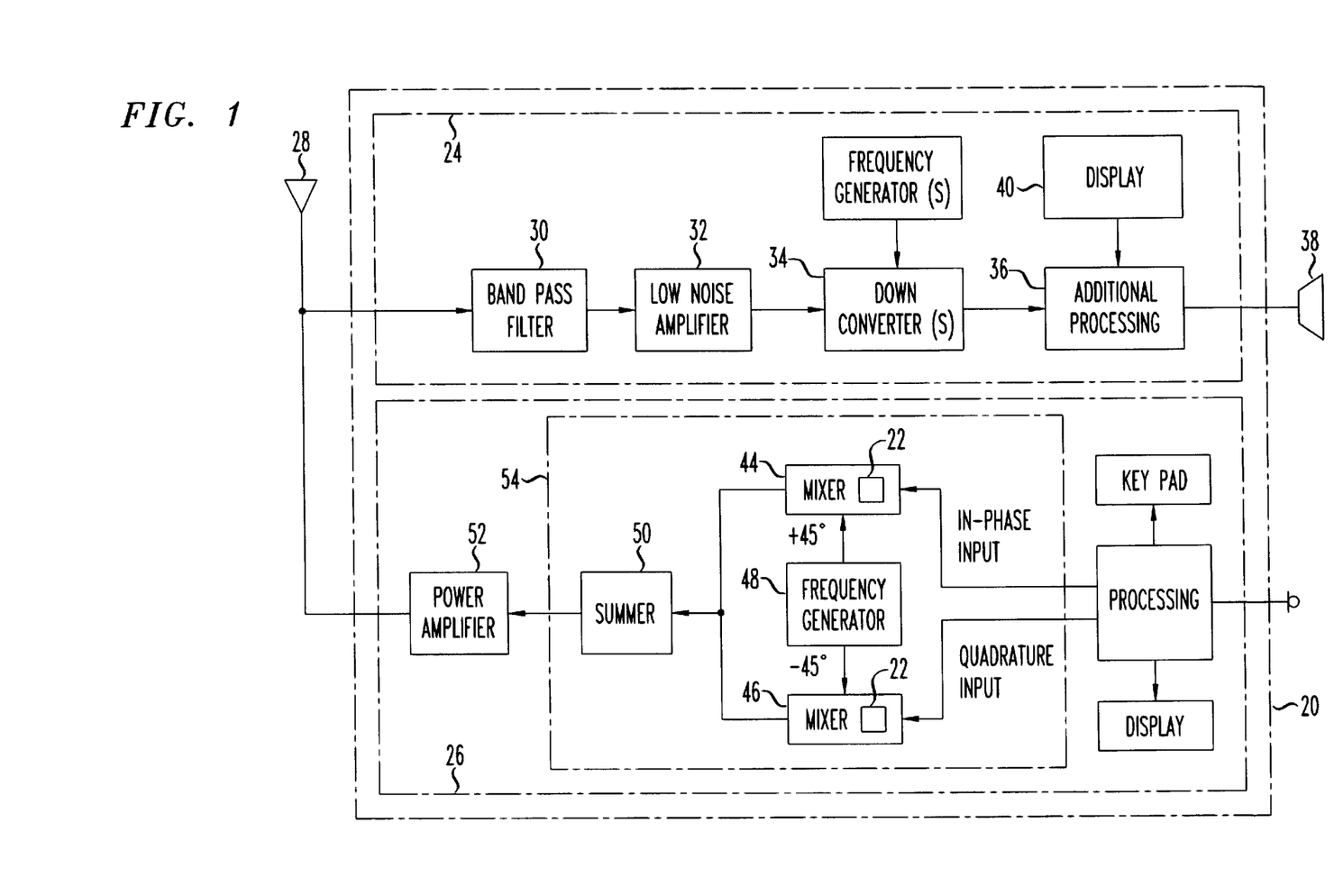
FIG. 1 is a block diagram of a transceiver in accordance with the present invention.

A block diagram of a transceiver 20 in accordance with the present invention is shown in FIG. 1. Transceiver 20 is comprised of receiver 24 and transmitter 26. Transceiver 20 includes a transconductance amplifier 22 (see FIG. 2) for receiving a differential input voltage and for providing a differential current output over a wide linear range. Transconductance amplifier 22 includes a lowpass filter between transistors forming a current mirror.

Transceiver 20, shown in the simplified block diagram of FIG. 1, is illustrative of a communications system or portions of a communication system including but not limited to a two-way radio, a cellphone handset, a cellphone base station, a broadband video tuner, a television set-box, or a personal computer cable modem.

In a cellphone handset application illustrated in FIG. 1, a signal received by antenna 28 is processed by receiver 24 by being passed through a band-pass filter 30, a low-noise amplifier 32, and down-converted in one or more stages 34 before additional processing 36 to drive another device such as speaker 38 and other output devices 40. Information to be transmitted by transmitter 26, such as voice or data, is processed by block 42 and provided to mixers 44 and 46 as in-phase and quadrature input signals. Frequency generator 48 generates, in phase quadrature, local oscillator signals which are also provided to mixers 44 and 46. Summer 50 adds the outputs from mixers 44 and 46, and provides a signal output to power amplifier 52 which drives antenna 28 when a signal is transmitted by transmitter 26.

Modulator 54 is comprised of mixers 44 and 46 as well as summing block 50. While the direct modulator 54 illustrated in FIG. 1 is one possible implementation of a modulator, other modulator designs including but not limited to indirect and double quadrature modulators are considered within the scope of the invention.

Figure 2:
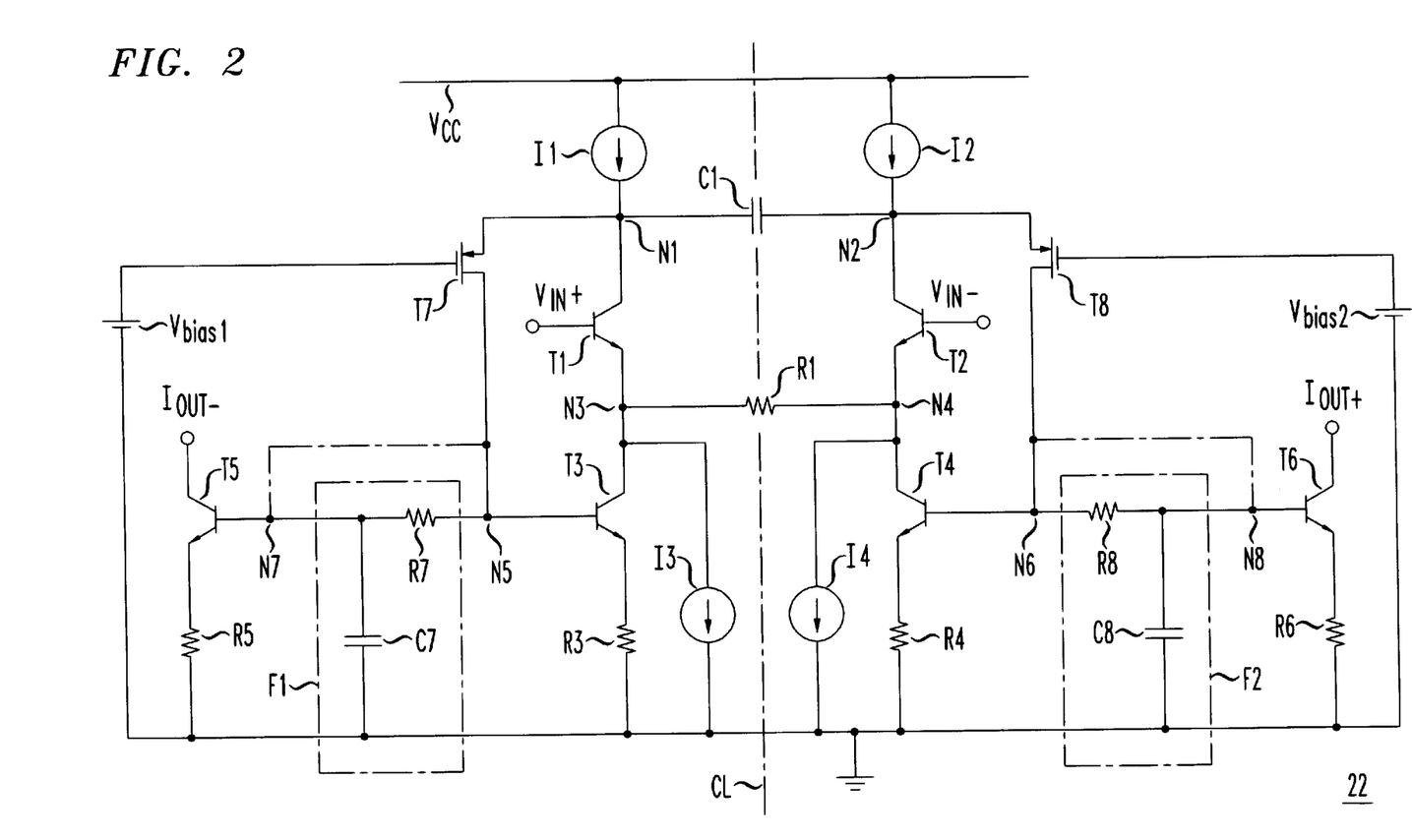
FIG. 2 is a schematic diagram of a transconductance amplifier in accordance with the present invention.

Mixers 44 and 46 include a transconductance amplifier 22 shown in the simplified schematic diagram of FIG. 2. Transconductance amplifier 22 is typically symmetrical, as shown in FIG. 2 from left-to-right about centerline CL. Device pairs on opposite sides of centerline CL in the symmetrical embodiment are identical.

Current sources I1 and I2 are constant current sources coupled to the more positive rail, $V_{cc}$, of transconductance amplifier 22, and provide bias currents to transconductance amplifier 22. Capacitor C1, when present, is coupled between the output of current sources I1 and I2, also designated as nodes N1 and N2. Capacitor C1 is a compensation capacitor that enhances overall stability of the feedback loops within transconductance amplifier 22. Transistors T1 and T2, illustrated in the FIG. 2 embodiment as bipolar transistors, have collectors coupled to nodes N1 and N2 and emitters coupled to nodes N3 and N4, respectively. The transistors T1 and T2 are input devices, receiving a positive and negative differential input voltage signal at respective bases, $V_{in+}$ and $V_{in-}$ thereof.

Degeneration resistor R1 is coupled between nodes N3 and N4. A constant current is maintained through the collector-emitter conduction path of each of transistors T1 and T2 by current sources I1 and I2. With a constant current through the conduction paths of both transistors T1 and T2, the base-emitter voltage remains constant and a constant base-to-emitter voltage drop occurs with the result that the differential input voltage signal applied to terminals $V_{in+}$ and $V_{in-}$ appears across resistor R1. The voltage developed across resistor R1 is proportional to the differential input voltage signal applied to transistors T1 and T2.

Transistors T3 and T4, illustrated in the FIG. 2 embodiment as bipolar transistors, have collectors coupled to nodes N3 and N4 respectively, and emitters coupled to resistors to R3 and R4, respectively. Resistors R3 and R4 are in turn coupled to the less positive rail, also designated ground in FIG. 2. A differential current, $\Delta I$ (positive assumed to be left-to-right in FIG. 2) passes through resistor R1 that, in magnitude is the instantaneous differential input voltage signal divided by the resistance of resistor R1. Assuming that the current, $I_0$, passing through the collector-emitter conduction path of transistors T1 and T2 is constant, the current passing through the collector-emitter conduction path of transistor T4 is $I_0+\Delta I$ and the current flowing in the conduction path of transistor T3 is $I_0-\Delta I$. The differential current passing through transistors T3 and T4 is directly proportional to the differential input voltage signal thereby providing input linearity for transconductance amplifier 22.

Transistors T7 and T8, illustrated in the FIG. 2 embodiment as PMOS transistors, provide feedback to current sources I1 and I2, respectively, of the operation of transistors T3 and T4, respectively. The source-to-drain conduction path of transistor T7 is coupled between node N1 and node N5, node N5 is also coupled to the base of transistor T3. The gate of transistor T7 is biased above the lower rail voltage by bias voltage $V_{bias}$. One skilled in the art could develop a bias voltage such as by a voltage divider, current source and an impedance, or other known techniques that would develop the bias voltage varying the frequency of applied differential voltage signal.

The source-to-drain conduction path of transistor T8 is coupled between node N2 and node N6; node N6 is also coupled to the base of transistor T4. The gate of T8 is biased above the lower rail in a manner similar to the bias of the gate of transistor T7. Transistors T7 and T8 provide feedback to nodes N1 and N2, respectively, to maintain constant current through the collector-to-emitter conduction paths of transistors T1 and T2 independent of the operation of transistors T3 and T4. See U.S. patent application Ser. No. 08/903012 entitled Broadband Linear Transconductance Amplifier with Resistive Pole-Splitting Compensation, filed Jul. 31, 1997, assigned to the same assignee as the present application, the disclosure of which is hereby incorporated by reference.

Lowpass filter F1 is between nodes N5 and N7 to filter wide band noise from the signal provided by transistor T3. Transistors T3 and T5 operate as a current mirror to replicate in the collector-emitter conduction path of transistor T5 a filtered representation of the current passing through the collector-emitter conduction path of transistor T3. Lowpass filter F2 is between nodes N6 and N8 to filter wideband noise from the signal provided by transistor T4. Transistors T4 and T6 operate as a current mirror to replicate in the collector- emitter conduction path of transistor T6 a filtered version of the current passing through the collector-emitter conduction path of transistor T4.

Linearity of transconductance amplifier 22 can be enhanced by maintaining a large DC bias current through the collector-emitter conduction paths of transistors T1 and T2, relative to the alternating signal current through resistor R1. While some DC current in the output is necessary, excessive DC current increases power dissipation of the circuit. Rather than reflect the large DC bias current to the output through the current mirrors comprised of transistors T3 and T5, and T4 and T6, current sources I3 and I4 are coupled to nodes N3 and N4, respectively, to remove some of the DC current before it is mirrored to the output transistors T5 and T6. The bias current provided by each of current sources I1 and I2 is greater than the corresponding current present in current sources I3 and I4 which reduce the DC current component in output transistors T5 and T6.

As is known in the art, a current mirror may be used to introduce a multiplication factor. For example, making the area of the output transistor, T5 or T6, a multiple M, times the area of the other transistor in the current mirror, T3 or T4, respectively and making the value of resistors R3 or R4, M times the value of resistors R5 or R6 will result in an output current that is M times as large as the input current. The proportional sizing maintains the same current density.

Lowpass filters F1 and F2 illustrated in FIG. 2 as a resistor-capacitor circuit may be implemented using other components such as an inductor-capacitor circuit. Lowpass filters F1 and F2 must be able to pass DC current for the circuit to operate.

While the low pass filters F1 and F2 are shown as single pole filters, the invention is not limited thereto. Filters having multiple poles would also function to filter out wideband noise. Furthermore, more complex filters such as, but not limited to, Butterworth and Chelychev filters could be used. Any low pass filter having a cut-off frequency set high enough to pass the desired signal while low enough to attenuate wideband noise will suffice. The cut-off frequency will be dependent on the application and vary from one application to another.

An advantage of filtering the signal in the transconductance amplifier is that the signal has not yet been up-converted to a higher frequency, such as from a baseband frequency to a radio frequency. Once a signal is up-converted to a higher frequency, the noise that must be filtered out is separated from the desired signal by a relatively small spatial distance in frequency, as compared to the noise being separated from the desired signal by such a large spatial distance in frequency at the lower, baseband frequency. For example the transmit and receive bands in a cellular telephone may be separated by 45 MHz in a system transmitting and receiving on frequencies in the 900 MHz range. With a desired signal in a baseband of 30 kHz, it is evident that the quality factor of a filter required to filter out wideband noise prior to frequency upconversion would have a quality factor, Q, as follows:

$$Q_1 = \frac{30 \text{ kHz}}{45 \text{ MHz}} = .67 \times 10^{-3}$$

After up-converting to 900 MHz, to filter out the same wideband noise would require a filter with a quality factor of:

$$Q_2 = \frac{900 \text{ MHz}}{45 \text{ MHz}} = 20$$

The noise that is filtered out is present on the differential input voltage signal received by the transconductance amplifier as well as noise introduced by all components of the transconductance amplifier. Incorporating the filter in transconductance amplifier 22 removes noise present on the differential input voltage signal received by the transconductance amplifier as well as noise introduced by all components of the transconductance amplifier 22 except output transistors T5 and T6.

While FIG. 2 illustrates the feedback loops coupled to nodes N5 and N6, the transconductance amplifier 22 will operate, albeit less effectively, if the feedback loop coupled respectively to nodes N7 and N8, as illustrated by the broken lines in FIG. 2, instead of being coupled to nodes N5 and N6.

FIG. 2 illustrates a transconductance amplifier 22 in accordance with the present invention in which transistors T1 through T6 are fabricated as bipolar devices and transistors T7 and T8 are fabricated as complementary metal oxide semiconductor (CMOS) devices. One skilled in the art could modify the circuit and still be within the scope of the invention.

Figure 3:
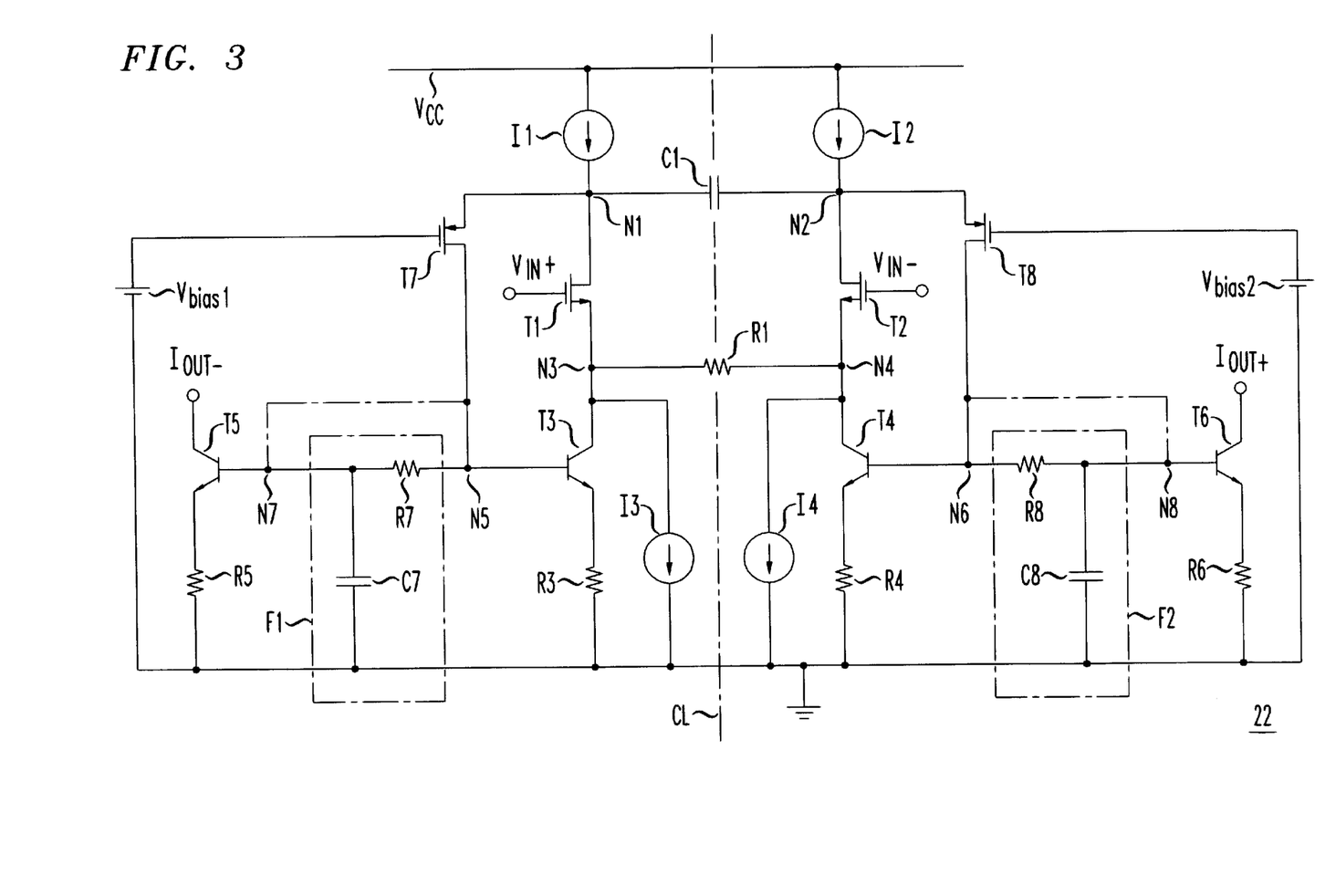
FIG. 3 is a schematic diagram of an alternative embodiment transconductance amplifier in accordance with the present invention.

Various alternative embodiments are illustrated in FIGS. 3–10. These embodiments are not intended to be exhaustive of all possible variations. The alternative embodiments illustrated in FIGS. 3–10 maintain pairs of transistors across center line CL as being devices of the same type, bipolar or CMOS. FIG. 3 illustrates an alternative embodiment transconductance amplifier in which the resistors T1, T2, T7 and T8 are CMOS devices and transistors T3, T4, T5 and T6 are bipolar devices.

Figure 4:
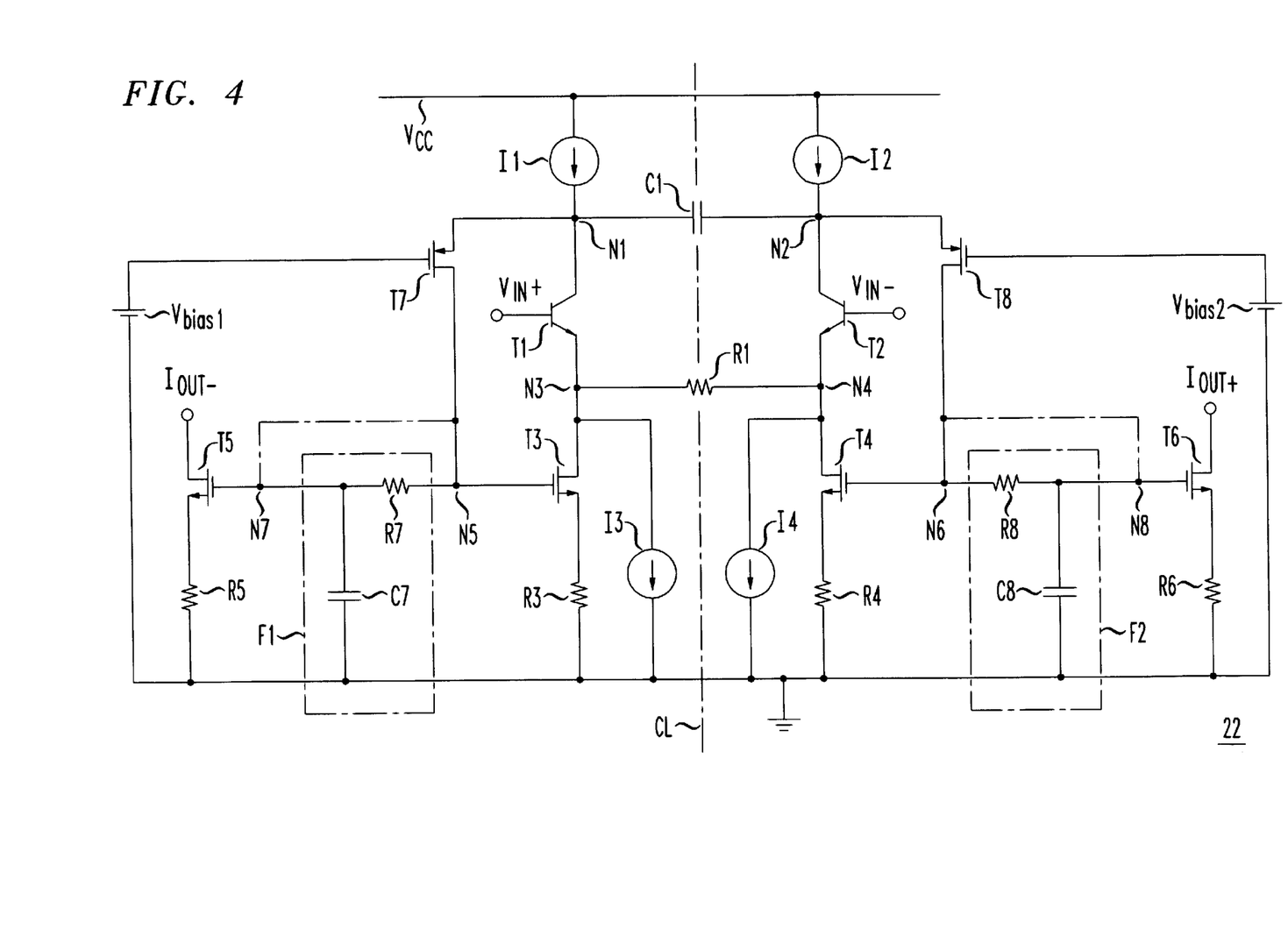
FIG. 4 is a schematic diagram of another alternative embodiment transconductance amplifier in accordance with the present invention.

FIG. 4 illustrates an alternative embodiment transconductance amplifier in which the input transistors T1 and T2 are bipolar devices and the other transistors are CMOS devices.

Figure 5:
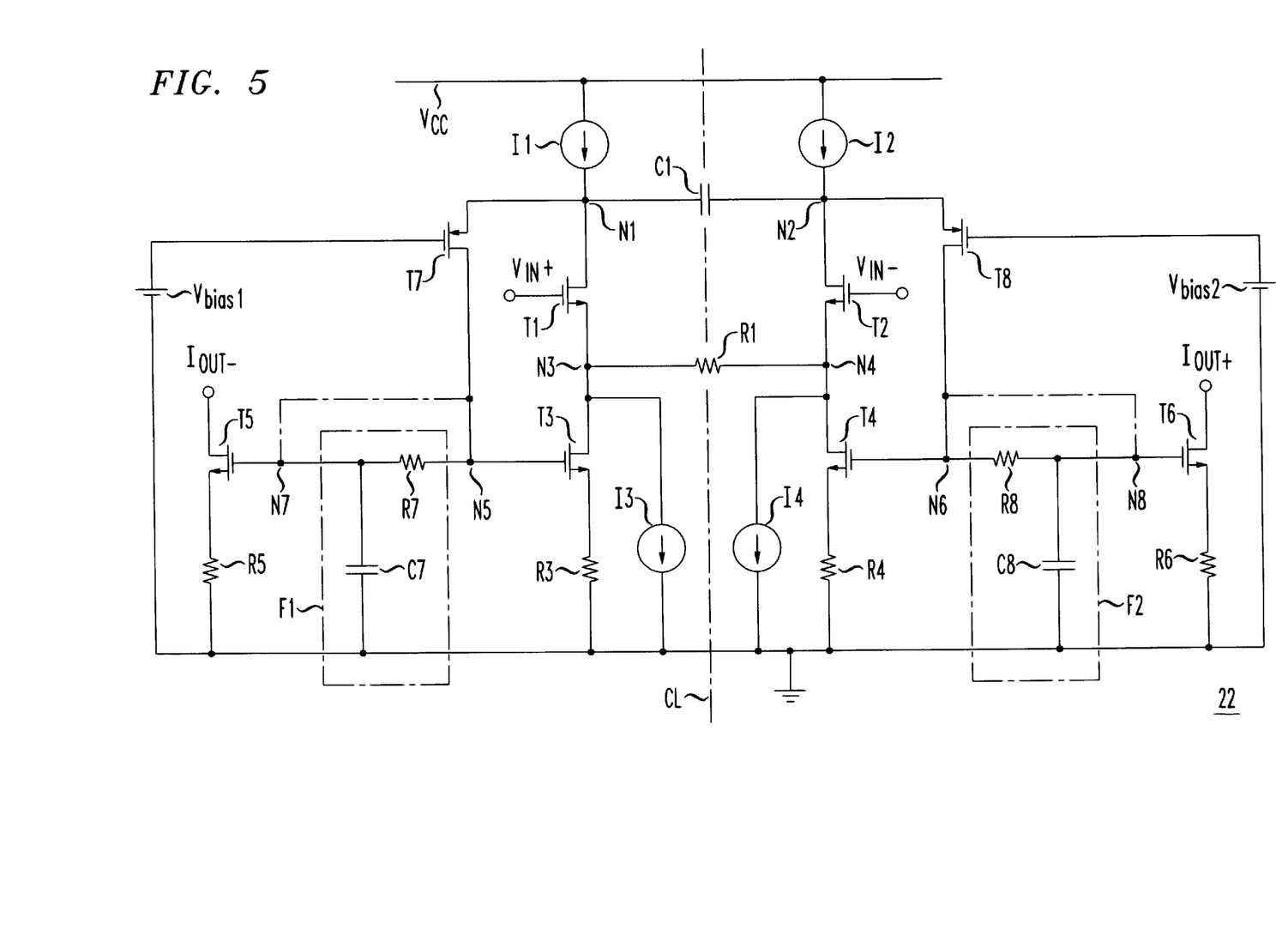
FIG. 5 is a schematic diagram of another alternative embodiment transconductance amplifier in accordance with the present invention.

FIG. 5 illustrates an alternative embodiment transconductance amplifier in which all of the transistors are CMOS devices.

Figure 6:
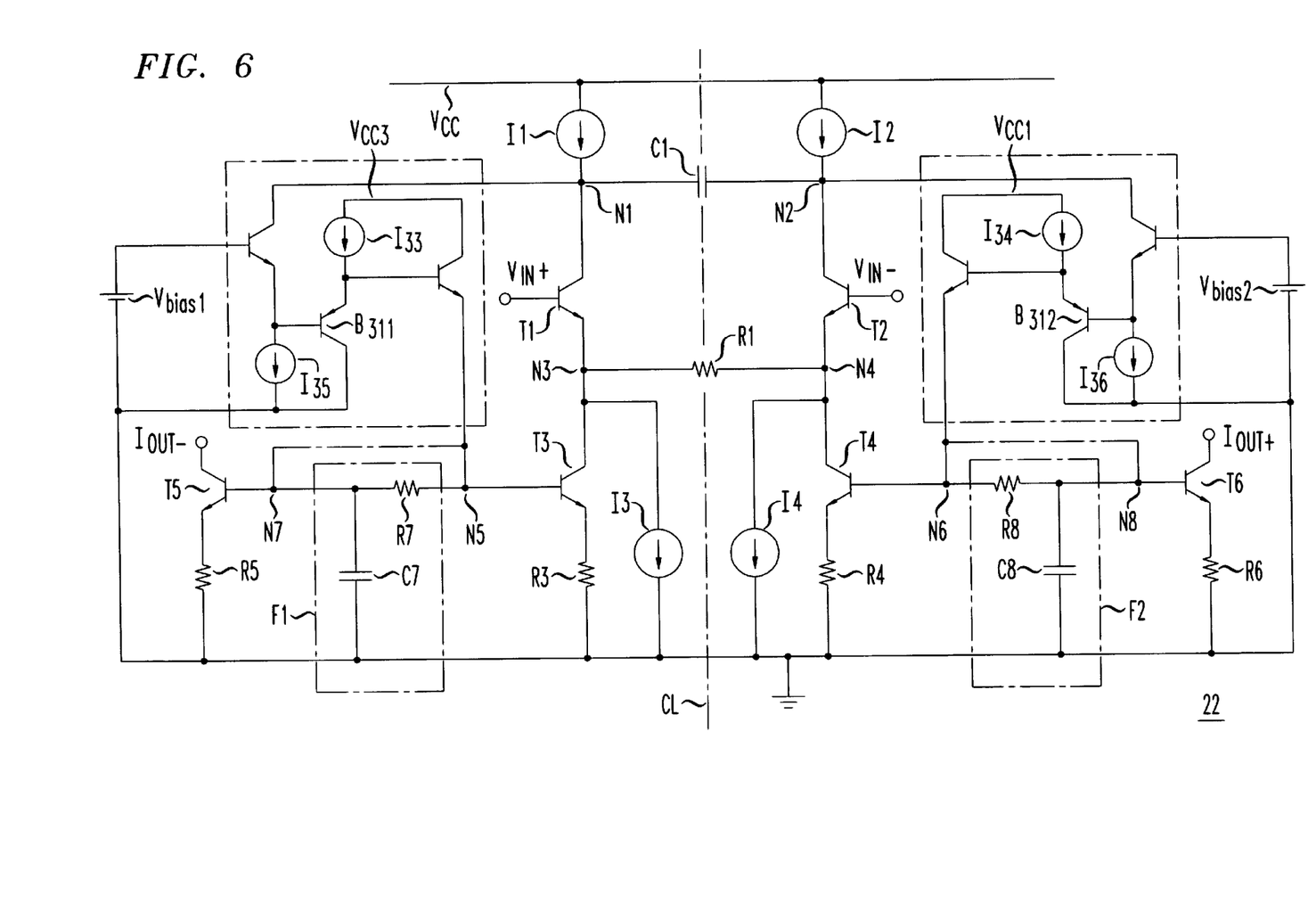
FIG. 6 is a schematic diagram of another alternative embodiment transconductance amplifier in accordance with the present invention.

FIG. 6 illustrates an alternative embodiment transconductance amplifier in which transistors T1 through T6 are bipolar devices and the individual transistors T7 and T8 are replaced by a feedback circuit incorporating several transistors.

Figure 7:
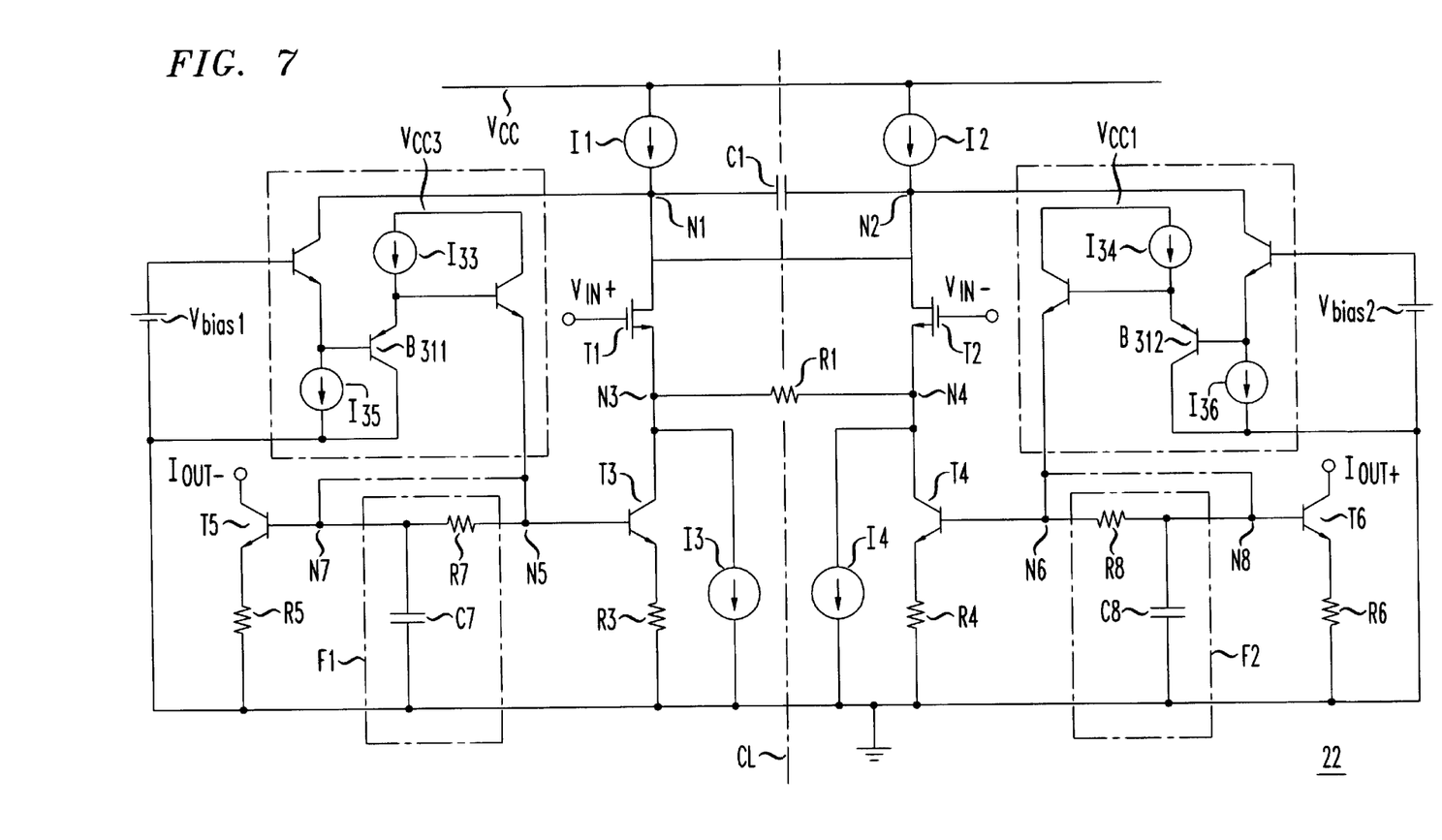
FIG. 7 is a schematic diagram of another alternative embodiment transconductance amplifier in accordance with the present invention.

FIG. 7 is an alternative embodiment transconductance amplifier in which the input transistors T1 and T2 are CMOS devices, transistors T3, T4, T5 and T6 are bipolar devices and the feedback transistors T7 and T8 of FIG. 2 are replaced by a feedback circuit including several transistors.

Figure 8:
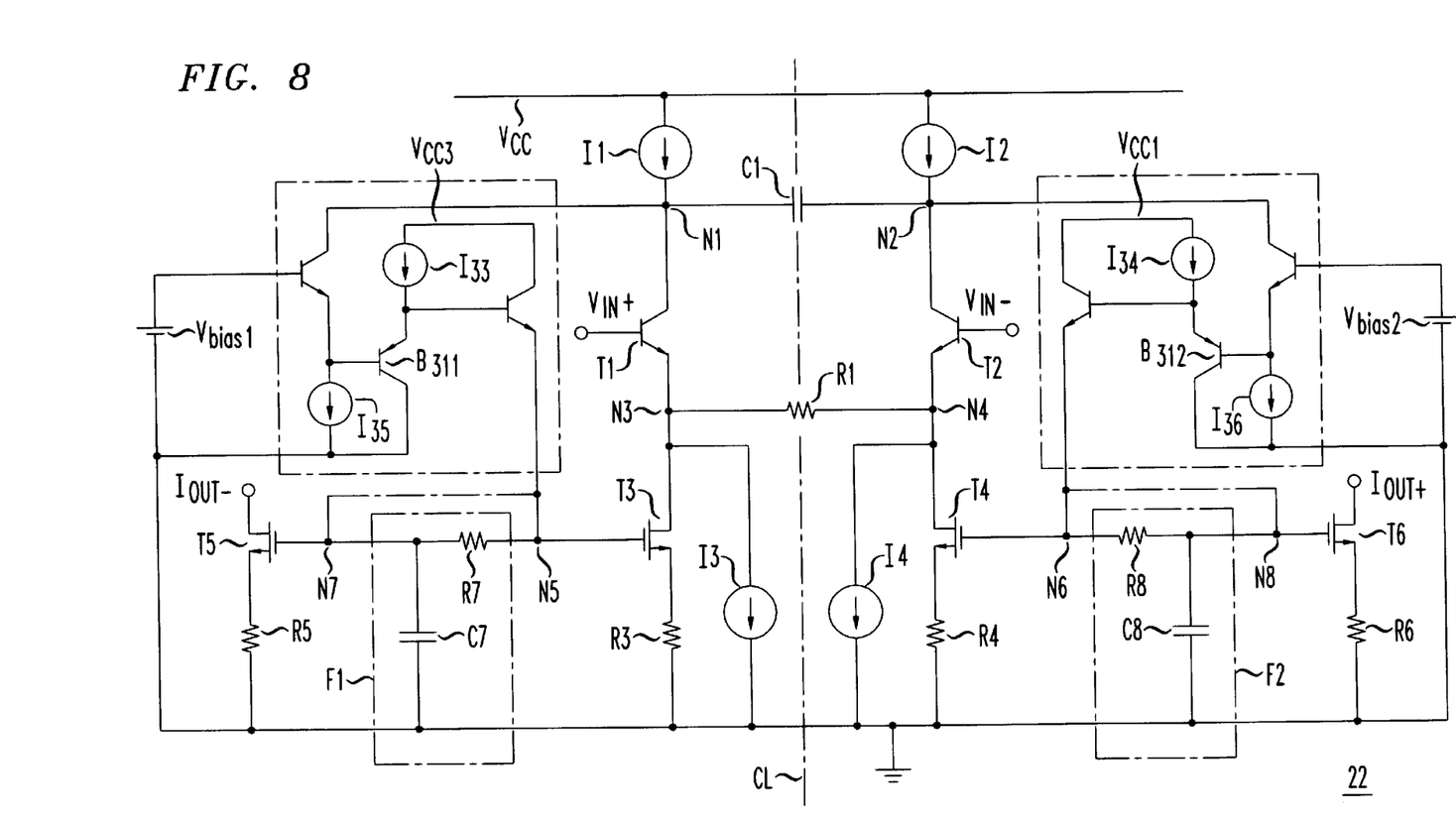
FIG. 8 is a schematic diagram of another alternative embodiment transconductance amplifier in accordance with the present invention.

FIG. 8 is an alternative embodiment transconductance amplifier in which the input transistors T1 and T2 are bipolar devices, the transistors T3, T4, T5 and T6 are CMOS devices, and the feedback transistors T7 and T8 of FIG. 2 are replaced by a multi-transistor feedback circuit.

Figure 9:
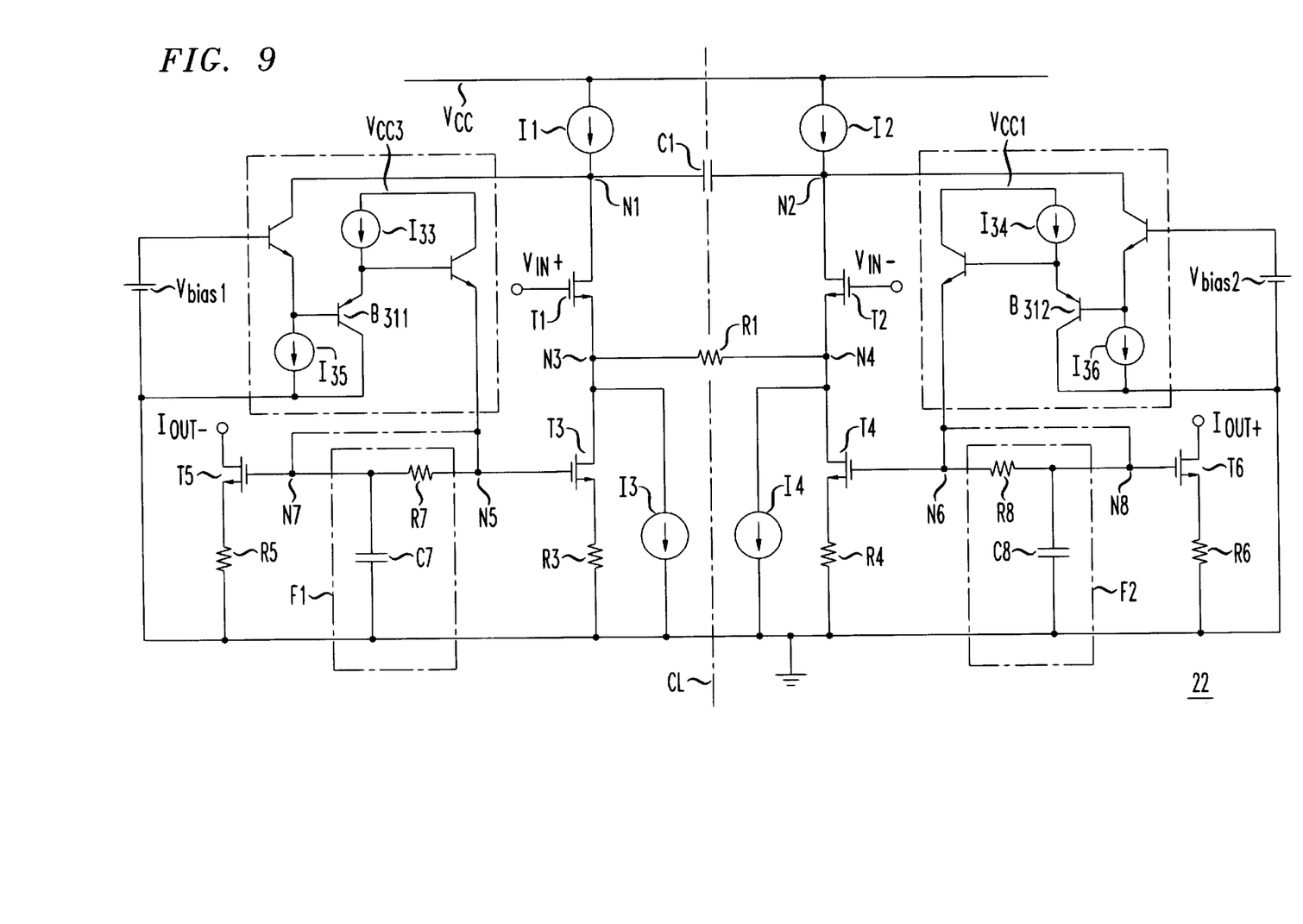
FIG. 9 is a schematic diagram of another alternative embodiment transconductance amplifier in accordance with the present invention.

FIG. 9 is an alternative embodiment transconductance amplifier in which transistors T1, T2, T3, T4, T5 and T6 are CMOS devices and the feedback transistors T7 and T8 of FIG. 2 have been replaced by a multiple transistor feedback circuit.

Figure 10:
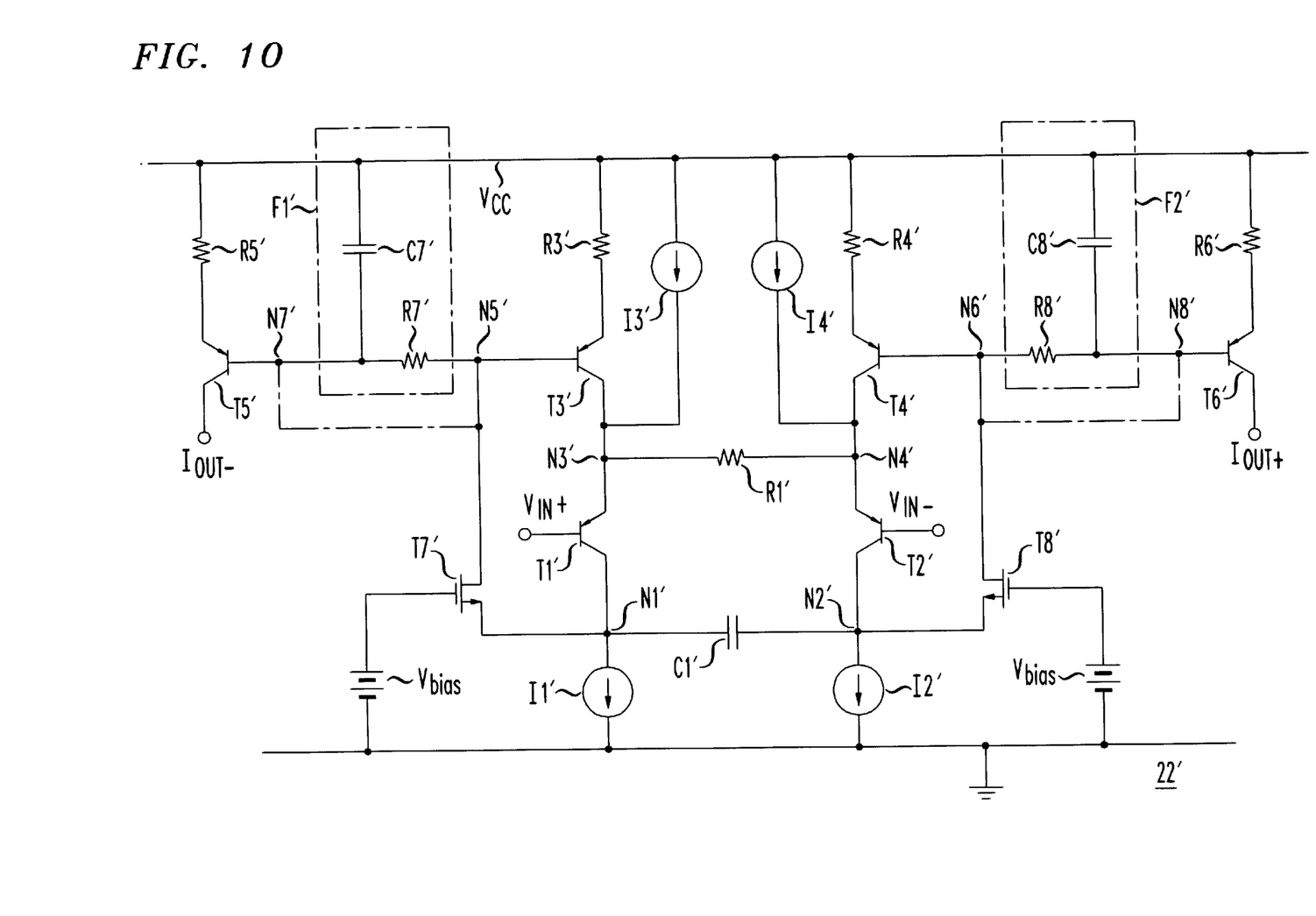
FIG. 10 is a schematic diagram of a transconductance amplifier in accordance with the present invention that is a complement to the transconductance amplifier of FIG. 2.

FIG. 10 is an alternative embodiment transconductance amplifier that is complementary to the transconductance amplifier illustrated in FIG. 2. In the complementary transconductance amplifier of FIG. 10, each of the p-type transistors has been changed to an n-type transistor, each of the n-type transistors has been changed to a p-type transistor, each of the npn-type transistor has been changed to a pnp-type transistor and the polarity has been reversed on the rails. While only one complementary circuit has been illustrated, FIG. 10 being complementary to FIG. 2, one skilled in the art would recognize that a complementary circuit for each of the embodiments illustrated in FIG. 3 through 9 could be generated.

The invention may be fabricated as an integrated circuit in bipolar, biCMOS or CMOS technology as appropriate for the type or types of transistors included therein.

While the signal lines illustrated in FIG. 1 are shown as a single line, one skilled in the art would know that differential signals may be employed.

What is claimed is:

1. A transconductance amplifier, comprising:

first and second current sources coupled to a more positive rail;

first and second input transistors, each input transistor coupled between a current source and a less positive rail, the input transistors having respective first terminals coupled to the current sources and second terminals for receiving a differential input voltage signal thereon;

an impedance coupled between respective third terminals of the first and second input transistors;

third and fourth transistors having a respective first terminals coupled to respective third terminals of the first and second transistors, respective second terminals coupled to the less positive rail, and respective third terminals coupled to a feedback circuit coupled to the first terminal of respective first and second transistors;

first and second current mirror transistors having a respective terminal coupled to the third terminal of the third and fourth transistors, each of the first and second current mirror transistors also having another terminal at which an output from the transconductor amplifier is presented; and first and second low pass filters, the first low pass filter coupled between the third terminal of the third transistor and the first current mirror transistor, the second low pass filter coupled between the third terminal of the fourth transistor and the second current mirror transistor.

2. A transconductance amplifier, as recited in claim 1, further comprising:

a capacitance coupled between the first terminals of the first and second transistors.

3. A transconductance amplifier, as recited in claim 1, further comprising:

a third current source, the third current source coupled between the first terminal of the third transistor and the lesser positive rail.

4. A transconductance amplifier, as recited in claim 3, further comprising:

a fourth current source, the fourth current source coupled between the first terminal of the fourth transistor and the lesser positive rail.

5. A transconductance amplifier as recited in claim 1, wherein the first, second, third, fourth, first current mirror and second current mirror transistors are bipolar devices.

6. A transconductance amplifier as recited in claim 5, wherein the feedback circuit is comprised of bipolar devices.

7. A transconductance amplifier as recited in claim 5, wherein the feedback circuit is comprised of complementary metal oxide semiconductor devices.

8. A transconductance amplifier as recited in claim 1, wherein the third, fourth, first current mirror and second current mirror transistors are bipolar devices, and the first and second transistors are complementary metal oxide semiconductor devices.

9. A transconductance amplifier as recited in claim 8, wherein the feedback circuit is comprised of bipolar devices.

10. A transconductance amplifier as recited in claim 8, wherein the feedback circuit is comprised of complementary metal oxide semiconductor devices.

11. A transconductance amplifier as recited in claim 1, wherein the first and second transistors are bipolar devices and the third, fourth, first current mirror and second current mirror transistors are complementary metal oxide semiconductor devices.

12. A transconductance amplifier as recited in claim 11, wherein the feedback circuit is comprised of bipolar devices.

13. A transconductance amplifier as recited in claim 11, wherein the feedback circuit is comprised of complementary metal oxide semiconductor devices.

14. A transconductance amplifier as recited in claim 1, wherein the first, second, third, fourth, first current mirror and second current mirror transistors are complementary metal oxide semiconductor devices.

* * * * *